(12) United States Patent
Zhou et al.

(10) Patent No.: US 12,100,636 B2
(45) Date of Patent: Sep. 24, 2024

(54) CHIP HEAT DISSIPATING STRUCTURE, CHIP STRUCTURE, CIRCUIT BOARD AND SUPERCOMPUTING DEVICE

(71) Applicant: Bitmain Technologies Inc., Beijing (CN)

(72) Inventors: Tao Zhou, Beijing (CN); Yong Gao, Beijing (CN)

(73) Assignee: Bitmain Technologies Inc., Beijing (CN)

( * ) Notice: Subject to any disclaimer, the term of this patent is extended or adjusted under 35 U.S.C. 154(b) by 567 days.

(21) Appl. No.: 17/327,027

(22) Filed: May 21, 2021

(65) Prior Publication Data

US 2021/0280489 A1 Sep. 9, 2021

Related U.S. Application Data

(63) Continuation of application No. PCT/CN2018/117260, filed on Nov. 23, 2018.

(51) Int. Cl.
*H01L 23/367* (2006.01)
*H01L 21/48* (2006.01)
(Continued)

(52) U.S. Cl.
CPC ...... *H01L 23/3672* (2013.01); *H01L 21/4871* (2013.01)

(58) Field of Classification Search
CPC ............. H01L 23/3672; H01L 21/4871; H01L 21/561; H01L 23/3128; H01L 24/27;
(Continued)

(56) References Cited

U.S. PATENT DOCUMENTS

2005/0121776 A1* 6/2005 Deppisch ................ H01L 23/42
438/117
2008/0122061 A1 5/2008 Edwards
(Continued)

FOREIGN PATENT DOCUMENTS

CN 2567770 Y 8/2003
CN 1670952 A 9/2005
(Continued)

OTHER PUBLICATIONS

First Office Action for related Chinese Patent Application No. 201911053263.8.
(Continued)

*Primary Examiner* — Herve-Louis Y Assouman (57) ABSTRACT

The present application relates to a chip heat dissipating structure, a chip structure, a circuit board and a supercomputing device, and the chip heat dissipating structure includes a metal layer, where the metal layer is covered on the chip. By adding a metal layer on the top of the chip, the heat sink may be soldered onto the metal layer through a solder layer, so that the heat sink is fixed to the top of the chip; the main component of the solder layer is metal tin, and the metal layer has a higher thermal conductivity than an epoxy resin material mounted on a traditional heat sink, thereby solving a problem of the heat dissipation bottleneck of a resin material in the chip, thus improving a heat dissipation effect of the chip and preventing a large amount of heat from damaging the chip.

15 Claims, 12 Drawing Sheets

(51) Int. Cl.
*H01L 21/56* (2006.01)
*H01L 23/00* (2006.01)
*H01L 23/13* (2006.01)
*H01L 23/31* (2006.01)
*H01L 23/373* (2006.01)
*H01L 23/42* (2006.01)
*H01L 23/433* (2006.01)

(58) Field of Classification Search
CPC ..... H01L 24/29; H01L 24/97; H01L 23/3736; H01L 24/16; H01L 24/32; H01L 24/73; H01L 2224/13082; H01L 2224/16225; H01L 2224/2732; H01L 2224/29339; H01L 2224/73253; H01L 2924/10156; H01L 2924/10158; H01L 2924/15311; H01L 2924/181; H01L 23/42; H01L 23/4334; H01L 2224/18; H01L 2224/32013; H01L 2224/32245; H01L 2224/97; H01L 2924/18161; H01L 21/4803; H01L 23/13; H01L 23/3735
See application file for complete search history.

(56) References Cited

U.S. PATENT DOCUMENTS

| | | | | |
|---|---|---|---|---|
| 2008/0157348 | A1* | 7/2008 | Hu | H01L 23/4275 257/713 |
| 2009/0071384 | A1 | 3/2009 | Tajima et al. | |
| 2011/0256668 | A1* | 10/2011 | Urano | H01L 24/03 438/114 |
| 2014/0264820 | A1* | 9/2014 | Hu | H01L 23/3736 257/713 |
| 2014/0353813 | A1* | 12/2014 | Park | H01L 23/3128 257/712 |
| 2016/0035647 | A1* | 2/2016 | Ochi | H01L 25/105 257/690 |
| 2020/0100357 | A1* | 3/2020 | Olivadese | H10N 60/805 |

FOREIGN PATENT DOCUMENTS

| | | | |
|---|---|---|---|
| CN | 101211872 | A | 7/2008 |
| CN | 101288351 | A | 10/2008 |
| CN | 101752327 | A | 6/2010 |
| CN | 102254880 | A | 11/2011 |
| CN | 104269384 | A | 1/2015 |
| CN | 104966677 | A | 10/2015 |
| CN | 105200574 | A | 12/2015 |
| CN | 105307382 | A | 2/2016 |
| CN | 106997870 | A | 8/2017 |
| CN | 107787112 | A | 3/2018 |
| CN | 107851588 | A | 3/2018 |
| CN | 108109974 | A | 6/2018 |
| CN | 108281397 | A | 7/2018 |
| CN | 108305857 | A | 7/2018 |
| CN | 109755191 | A | 5/2019 |
| CN | 110098162 | A | 8/2019 |
| CN | 110265306 | A | 9/2019 |
| CN | 110364505 | A | 10/2019 |

OTHER PUBLICATIONS

Second Office Action for related Chinese Patent Application No. 201911053263.8.
Search Report for related Chinese Patent Application No. 201911053263.8.
Search Report for related Chinese Patent Application No. 201911053347.1.
First Office Action for related Chinese Patent Application No. 201911053347.1.
Second Office Action for related Chinese Patent Application No. 201911053347.1.
Third Office Action for related Chinese Patent Application No. 201911053347.1.
First Supplementary Search Report for related Chinese Patent Application No. 201911053347.1.
Second Supplementary Search Report for related Chinese patent Application No. 201911053347.1.
Search Report for related Chinese Patent Application No. 201911053463.3.
First Office Action for related Chinese Patent Application No. 201911053463.3.
Second Office Action for related Chinese Patent Application No. 201911053463.3.
Supplementary Search Report for related Chinese patent Application No. 201911053463.3.
International Search Report dated Jul. 29, 2019 for International Patent Application No. PCT/CN2018/117260.

* cited by examiner

CHIP HEAT DISSIPATING STRUCTURE, CHIP STRUCTURE, CIRCUIT BOARD AND SUPERCOMPUTING DEVICE

CROSS-REFERENCE TO RELATED APPLICATIONS

This application is a continuation of International Application No. PCT/CN2018/117260, filed on Nov. 23, 2018, which is hereby incorporated by reference in its entirety.

TECHNICAL FIELD

The present application relates to the field of heat dissipation of a chip and, in particular, to a chip heat dissipating structure, a chip structure, a circuit board and a supercomputing device.

BACKGROUND

In current computing devices, a heat sink is usually attached to the top of a chip with thermally conductive glue to dissipate heat for the chip on a circuit board.

However, a thermal conductivity of traditional thermally conductive glue is generally lower than 2 watts/meter-degree (W/(m-C)), resulting in an unsatisfactory heat dissipation effect of the chip.

SUMMARY

The present application provides a chip heat dissipating structure, a chip structure, a circuit board and a supercomputing device to solve the problem that the heat dissipation effect of a current chip is not ideal.

Embodiments of the present application provide a chip heat dissipating structure arranged on a chip, where the chip heat dissipating structure includes a metal layer, the metal layer being covered on the chip.

Furthermore, the chip heat dissipating structure further includes: a heat sink connected with the metal layer.

Furthermore, the chip includes a wafer and a plastic encapsulating structure; and the metal layer is covered on the wafer and the plastic encapsulating structure of the chip.

Furthermore, an upper surface of the wafer is exposed.

Furthermore, an area of the metal layer is the same as an area of an upper surface of the chip.

Furthermore, the metal layer is a silver paste layer.

Furthermore, a thickness of the silver paste layer is 1-5 microns.

Furthermore, the heat sink is soldered onto the metal layer through a solder layer.

Furthermore, a solder in the solder layer is tin.

Furthermore, a thickness of the solder layer is 0.1-0.15 millimeters.

Furthermore, an area of the solder layer is the same as an area of the metal layer, or an area of the solder layer is the same as an area of a lower surface of the heat sink.

Furthermore, if an upper surface of the wafer is flush with an upper surface of the plastic encapsulating structure, the metal layer is a metal layer with a uniform thickness; if the upper surface of the wafer is lower than the upper surface of the plastic encapsulating structure, the metal layer is embedded in the plastic encapsulating structure; and if the upper surface of the wafer is higher than the upper surface of the plastic encapsulating structure, the wafer is embedded in the metal layer Embodiments of the present application further provide a chip structure, including a chip body and the chip heat dissipating structure as described in any one of the above substantially arranged on the chip body.

Embodiments of the present application further provide a circuit board on which at least one of the chip structure as described above is provided.

Embodiments of the present application further provide a supercomputing device in which at least one of the circuit board as described above is provided.

In the above aspects, by providing a chip heat dissipating structure composed of a metal layer, the chip heat dissipating structure is used to be arranged on the chip, and the metal layer is covered on a wafer and a plastic encapsulating structure of the chip; furthermore, a heat sink may be connected to the metal layer. Since a metal layer is added on the top of the chip, the heat sink may be soldered onto the metal layer through a solder layer, so that the heat sink is fixed to the top of the chip; the main component of the solder layer is metal tin, and the metal layer has a higher thermal conductivity than an epoxy resin material mounted on a traditional heat sink, thereby solving a problem of the heat dissipation bottleneck of a resin material in the chip, thus improving a heat dissipation effect of the chip and preventing a large amount of heat from damaging the chip.

BRIEF DESCRIPTION OF THE DRAWINGS

One or more embodiments are exemplified by the drawings. These exemplified descriptions and drawings do not constitute a limitation on the embodiments. Elements with the same reference numerals in the drawings are shown as similar elements, and the drawings do not constitute a limitation in terms of scale, and among them.

REFERENCE SIGNS

| 1-Metal layer | 2-Heat sink | 3-Bottom plate |
|---|---|---|
| 4-Dissipating fin | 5-Connecting portion | 6-Wafer |
| 7-Solder layer | 8-Plastic encapsulating structure | 9-Substrate |
| 10-Solder ball | 11-Circuit board | |

DESCRIPTION OF EMBODIMENTS

Embodiments of the present application are applied to a chip. It should be noted that when a solution of an embodiment of the present application is applied to a current chip or a chip that may appear in the future, names of various structures may change, but it is not affect the implementation of the solutions in embodiments of the present application.

It should be pointed out that terms or wordings involved in the embodiments of the present application may be referenced between each other, and will not be repeated.

In prior art, an exposed die package of a wafer refers to exposing the wafer to achieve a goal of better heat dissipation. Among them, a silicon wafer may be referred to as a wafer for short. While the exposed die package is performed, a traditional thermally conductive glue is used to attach a heat sink on the top of the chip, but the thermal conductivity of the traditional thermally conductive glue is generally lower than 2 W/(m-C), which leads to poor heat dissipation of the chip and becomes a heat dissipation bottleneck of a system. In order to achieve a better heat dissipation, a solder with a higher thermal property has become an ideal substitute for thermally conductive glue. The thermal conductivity of the solder is higher than 60 W/(m-C), which can greatly improve the heat dissipation efficiency of the chip. However, the solder cannot be well soldered onto the plastic encapsulating structure of the wafer and the chip.

A chip heat dissipating structure, a chip structure, a circuit board and a supercomputing device provided in the present application aim to solve the above technical problems in the prior art.

In order to a better understanding of features and technical contents of the embodiments of the present application, the implementations of the embodiments of the present application will be described in detail below with reference to the drawings. The attached drawings are for reference and explanation purposes only and are not used to limit the embodiments of the present application. In the following technical description, for a convenience of explanation, a number of details are used to provide a sufficient understanding of the disclosed embodiments. However, without these details, one or more embodiments can still be implemented. In other cases, in order to simplify the drawings, well-known structures and devices may be simplified for display.

Figure 1:
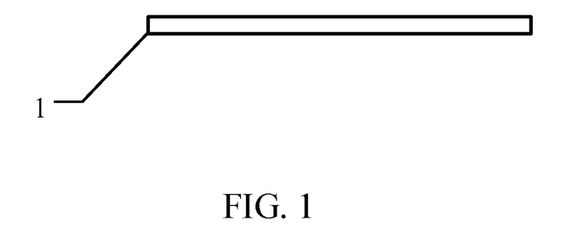
FIG. 1 is a structural schematic diagram I of a chip heat dissipating structure provided by an embodiment of the present application.
Figure 2:
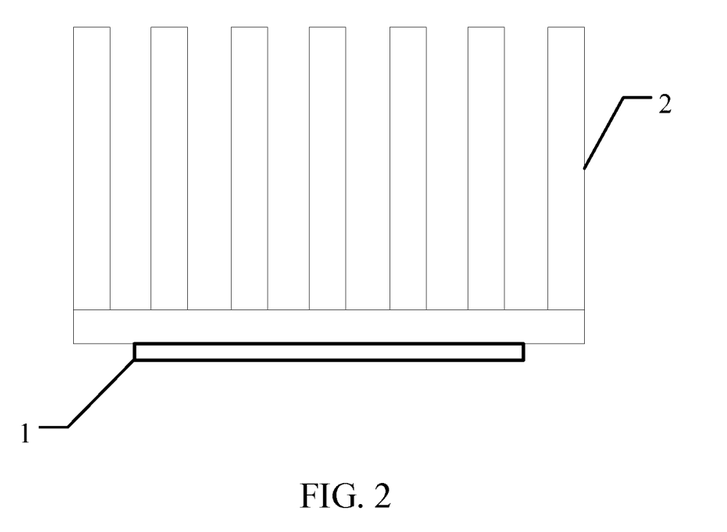
FIG. 2 is a structural schematic diagram II of a chip heat dissipating structure provided by an embodiment of the present application.
Figure 3:
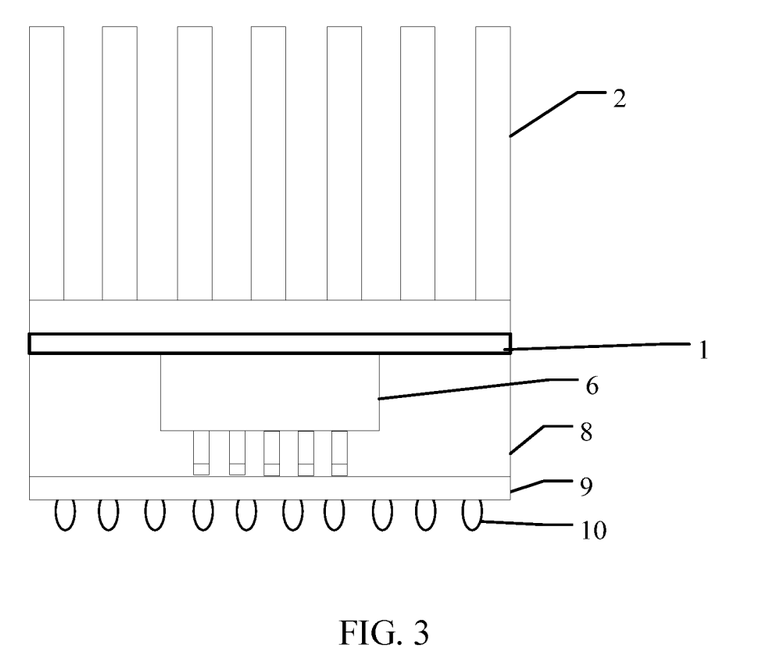
FIG. 3 is a structural schematic diagram III of a chip heat dissipating structure provided by an embodiment of the present application.

FIG. 1 is a structural schematic diagram I of a chip heat dissipating structure provided by an embodiment of the present application; FIG. 2 is a structural schematic diagram II of a chip heat dissipating structure provided by an embodiment of the present application; FIG. 3 is a structural schematic diagram III of a chip heat dissipating structure provided by an embodiment of the present application; as shown in FIG. 1 to FIG. 3, the chip heat dissipating structure is arranged on the chip, and the chip heat dissipating structure includes: a metal layer 1, where the metal layer 1 is covered on the chip.

Exemplarily, the chip heat dissipating structure provided in the present application may be arranged on the chip. Among them, the chip includes a wafer 6, a plastic encapsulating structure 8 and a substrate 9; a groove is arranged on the plastic encapsulating structure 8, and the wafer 6 may be arranged in the groove, and then the plastic encapsulating structure 8 is used to encapsulate the wafer 6 and an upper surface of the wafer 6 is exposed, which is an exposed die structure; the plastic encapsulating structure 8 is fixedly arranged on one side of the substrate 9; furthermore, at least one solder ball 10 may be arranged on the other side of the substrate 9, and the solder ball 10 is used to connect with a circuit board, so as to fix the chip on the circuit board.

As mentioned above, since the solder cannot be well soldered onto the wafer 6 and the plastic encapsulating structure 8 of the chip, in this application, the metal layer 1 is covered on the wafer 6 and the plastic encapsulating structure 8 at the same time to realize a connection of the chip and an external heat sink 2 by soldering.

A shape of the wafer 6 may be a circle, or a rectangle, or a square, or a trapezoid, or other regular shapes, or other irregular shapes; the shape of the wafer 6 is not limited in the present application. A material of the wafer 6 is not limited in the present application either.

A shape of the plastic encapsulating structure 8 is not limited in the present application, as long as the plastic encapsulating structure 8 can realize plastic encapsulation of the wafer 6. A material of the plastic encapsulating structure 8 is not limited in the present application either.

Optionally, the metal layer 1 may be grid-shaped, so that a cost of the metal layer 1 can be saved.

In another implementation, the chip heat dissipating structure further includes a heat sink 2, where the metal layer 1 is covered on the chip, that is, the metal layer 1 is covered on the wafer 6 and the plastic encapsulating structure 8; and the heat sink 2 and the metal layer 1 is connected by soldering.

A shape and a size of the heat sink 2 are not limited in the present application.

Figure 4:
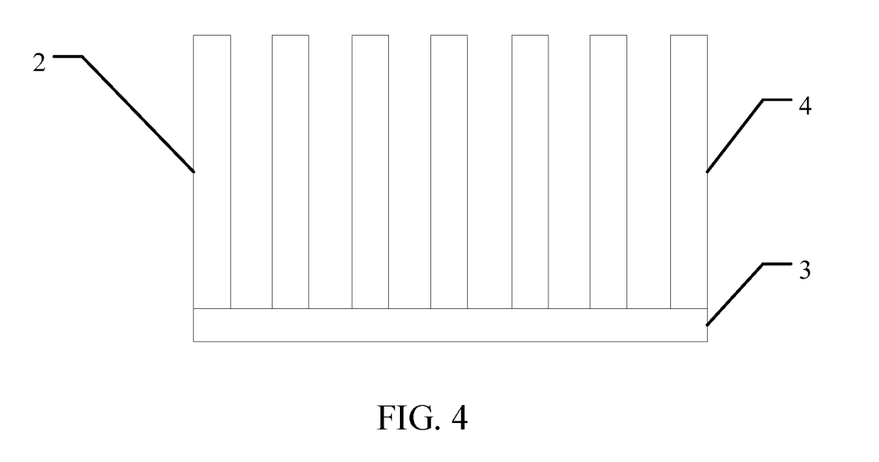
FIG. 4 is a structural schematic diagram I of a heat sink provided by an embodiment of the present application.

For example, FIG. 4 is a structural schematic diagram I of a heat sink provided by an embodiment of the present application. As shown in FIG. 4, the heat sink 2 is composed of a bottom plate 3 and at least one dissipating fin 4, and each dissipating fin 4 is fixedly connected to the bottom plate 3, and the bottom plate 3 is soldered to a surface of the metal layer 1.

Figure 5:
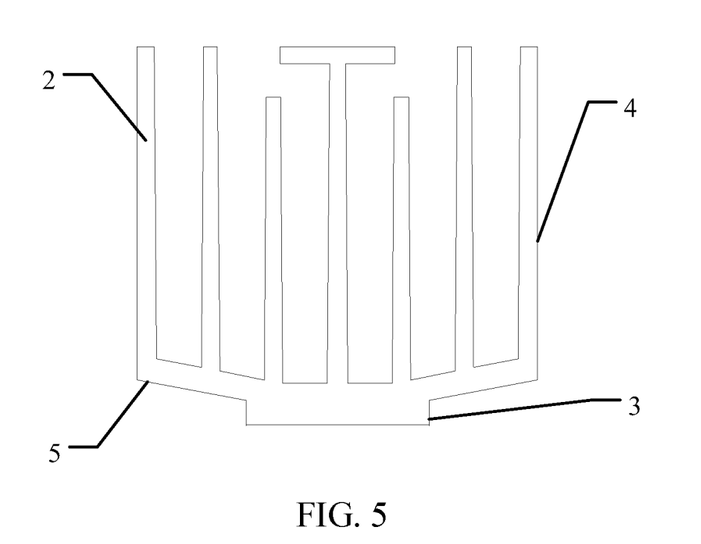
FIG. 5 is a structural schematic diagram II of a heat sink provided by an embodiment of the present application.

For another example, FIG. 5 is a structural schematic diagram II of a heat sink provided by an embodiment of the present application. As shown in FIG. 5, a connecting portion 5 may also be arranged on the heat sink 2, the connecting portion 5 is composed of a first plate and a second plate, and there is a preset angle between the first plate and the second plate, the preset angle may be in a range of 180 degrees to 90 degrees; furthermore, each dissipating fin 4 is fixedly arranged on an upper surface of the connecting portion 5, the bottom plate 3 is fixedly arranged on a lower surface of the connecting portion 5; moreover, a gripper may be arranged on one of the dissipating fins 4 of the heat sink 2.

In this embodiment, by providing a chip heat dissipating structure composed of a metal layer 1, the chip heat dissipating structure is used to be arranged on the chip, and the metal layer 1 is covered on a wafer 6 and a plastic encapsulating structure 8 of the chip; furthermore, a heat sink 2 may be connected to the metal layer 1. Since a metal layer is added on the top of the chip by physical sputtering, the heat sink 2 may be soldered onto the metal layer through a solder layer, and then the heat sink 2 is fixed to the top of the chip; the main component of the solder layer is metal tin, and the metal layer has a higher thermal conductivity than an epoxy resin material mounted on a traditional heat sink, thereby solving a problem of the heat dissipation bottleneck of a resin material in the chip, thus improving a heat dissipation effect of the chip and preventing a large amount of heat from damaging the chip.

Figure 6:
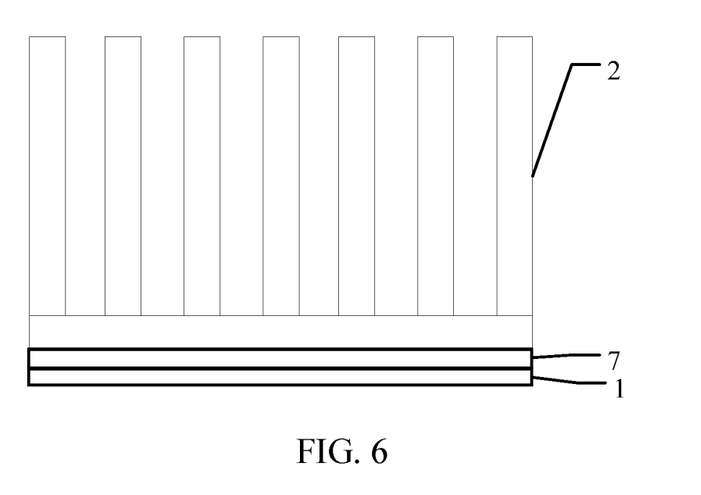
FIG. 6 is a structural schematic diagram I of another chip heat dissipating structure provided by an embodiment of the present application.
Figure 7:
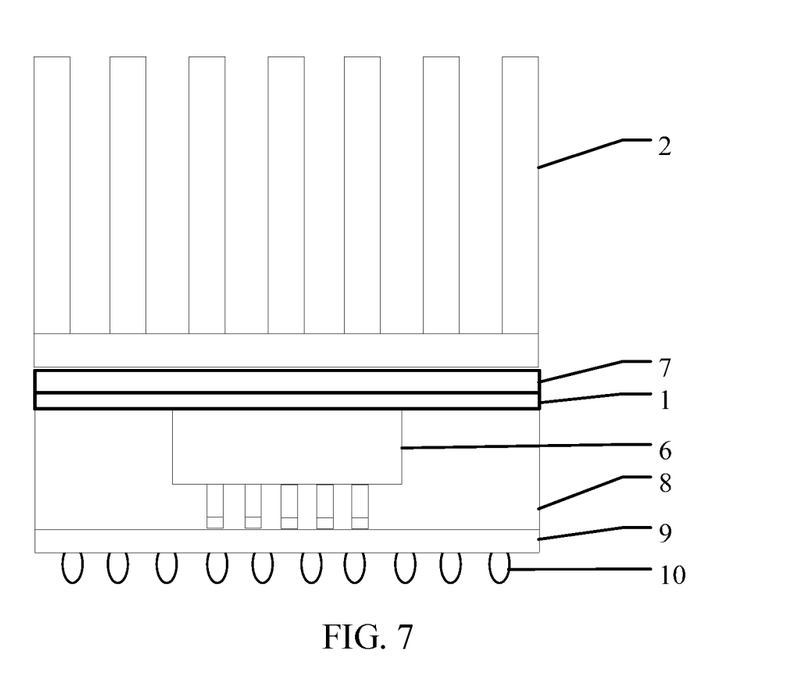
FIG. 7 is a structural schematic diagram II of another chip heat dissipating structure provided by an embodiment of the present application.

FIG. 6 is a structural schematic diagram I of another chip heat dissipating structure provided by an embodiment of the present application; FIG. 7 is a structural schematic diagram II of another chip heat dissipating structure provided by an embodiment of the present application; on the basis of the embodiments shown in FIG. 1, as shown in FIG. 6 and FIG. 7, an area of the metal layer 1 is the same as an area of an upper surface of the chip.

Optionally, the metal layer 1 is a silver paste layer. A thickness of the silver paste layer is 1-5 microns.

Optionally, the heat sink 2 is soldered onto the metal layer 1 through a solder layer 7. A solder in the solder layer 7 is tin. A thickness of the solder layer 7 is 0.1-0.15 millimeters.

Optionally, an area of the solder layer 7 is the same as an area of the metal layer 1, or an area of the solder layer 7 is the same as an area of a lower surface of the heat sink 2.

Optionally, if an upper surface of the wafer 6 is flush with an upper surface of the plastic encapsulating structure 8, the metal layer 1 is a metal layer 1 with a uniform thickness; if the upper surface of the wafer 6 is lower than the upper surface of the plastic encapsulating structure 8, the metal layer 1 is embedded in the plastic encapsulating structure 8; and if the upper surface of the wafer 6 is higher than the upper surface of the plastic encapsulating structure 8, the wafer 6 is embedded in the metal layer 1.

Exemplarily, on the basis of the embodiments shown in FIG. 1, the metal layer 1 is covered on the upper surfaces of the wafer 6 and the plastic encapsulating structure 8.

In this embodiment, a material of the metal layer 1 is silver paste, that is, the metal layer 1 is a silver paste layer, the silver paste layer is thus covered on the upper surfaces of the wafer 6 and the plastic encapsulating structure 8.

In order to facilitate the connection of the silver paste layer to the chip and the heat sink 2, and to facilitate a heat conduction of the silver paste layer and the heat dissipation of the chip, a thickness of the silver paste layer may be set to the following parameters: the thickness of the silver paste layer is 1-5 microns, preferably, the thickness of the silver paste layer is 1 microns.

In this embodiment, a solder layer is arranged on the silver paste layer; and the heat sink 2 and the solder layer 7 are soldered together. A material of the solder layer 7 is tin. Optionally, a thickness of the solder layer 7 is 0.1-0.15 millimeters; preferably, the thickness of the solder layer 7 is 0.13 millimeters. A thermal conductivity of the solder layer 7 is higher than 60 W/(m-C), which can improve the heat dissipation effect of the chip.

In this embodiment, an area of the silver paste layer is the same as the area of the upper surface of the chip, that is, the area of the silver paste layer is equal to a sum of the area of the upper surface of the wafer 6 and the area of the upper surface of the plastic encapsulating structure 8. As shown in FIG. 7, the area of the silver paste layer is the same as the area of the upper surface of the chip.

In this embodiment, regarding the area of the solder layer 7, the following implementations are provided.

An implementation I of the area of the solder layer 7: as shown in FIG. 7, the area of the solder layer 7 is the same as the area of the silver paste layer, and the area of the silver paste layer is the same as the area of the upper surface of the chip.

Figure 8:
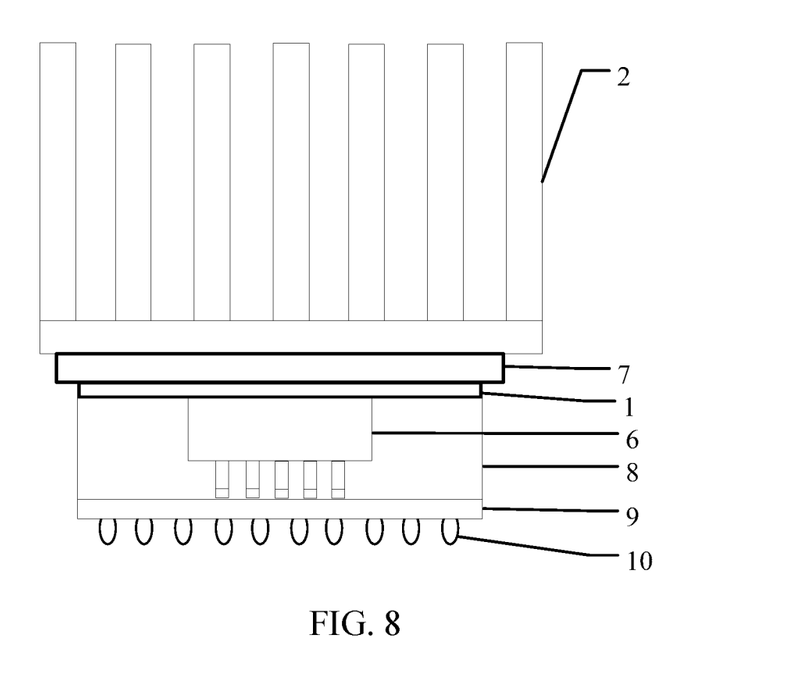
FIG. 8 is a structural schematic diagram III of another chip heat dissipating structure provided by an embodiment of the present application.

An implementation II of the area of the solder layer 7: FIG. 8 is a structural schematic diagram III of another chip heat dissipating structure provided by an embodiment of the present application, as shown in FIG. 8, the area of the solder layer 7 is different from the area of the silver paste layer, while the area of the silver paste layer is the same as the area of the upper surface of the chip.

Figure 9:
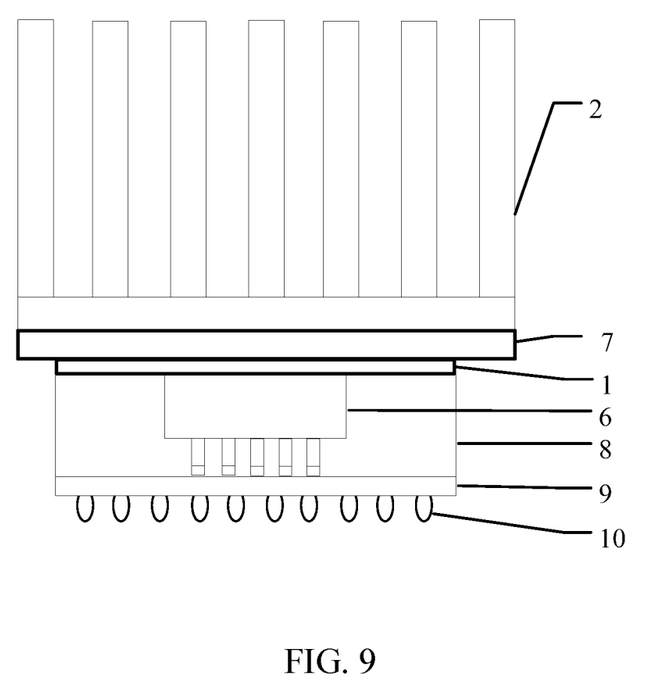
FIG. 9 is a structural schematic diagram IV of another chip heat dissipating structure provided by an embodiment of the present application.

An implementation III of the area of the solder layer 7: FIG. 9 is a structural schematic diagram IV of another chip heat dissipating structure provided by an embodiment of the present application, as shown in FIG. 9, the area of the solder layer 7 is the same as an area of the lower surface of the heat sink 2; where the area of the solder layer 7 is different from the area of the silver paste layer, and the area of the silver paste layer is the same as the area of the upper surface of the chip. The area of the solder layer 7 is the same as the area of a bottom surface of the heat sink 2, thus facilitating a good connection between the heat sink 2 and the solder layer 7.

An implementation IV of the area of the solder layer 7: as shown in FIG. 7, the area of the solder layer 7 is the same as an area of the lower surface of the heat sink 2; where the area of the solder layer 7 is the same as the area of the silver paste layer, and the area of the silver paste layer is the same as the area of the upper surface of the chip.

Regarding a positional relationship between the silver paste layer and the chip, the following implementations are provided.

Figure 10:
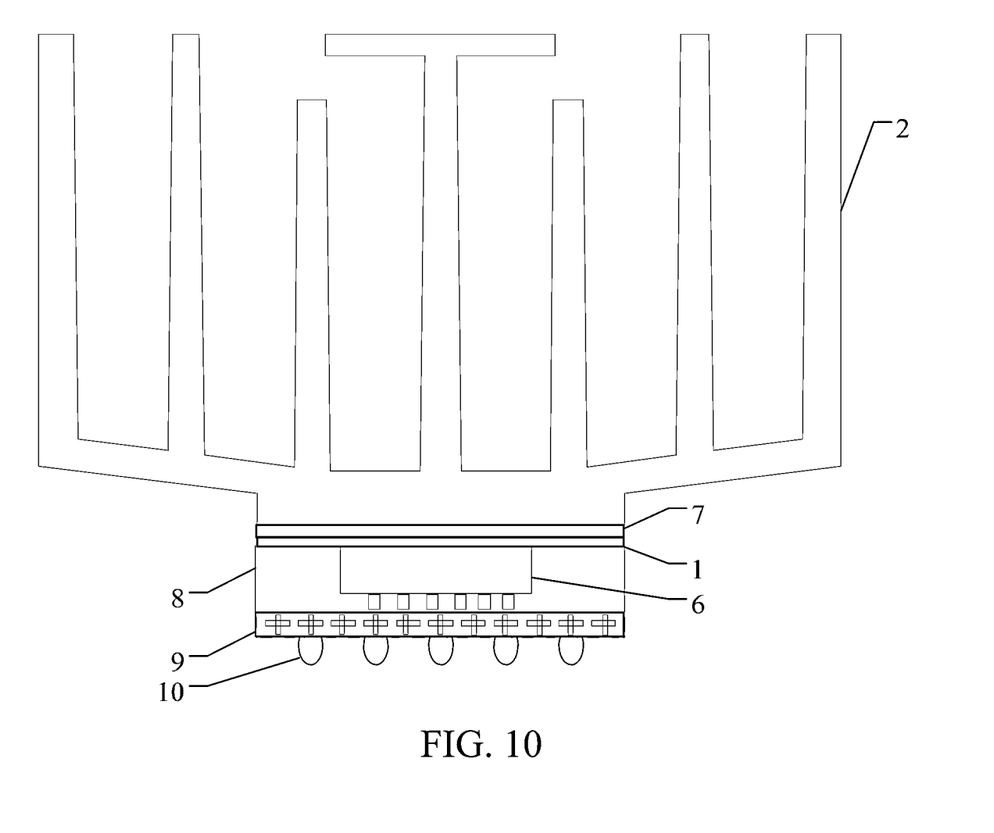
FIG. 10 is a structural schematic diagram V of another chip heat dissipating structure provided by an embodiment of the present application.

An implementation I of the positional relationship between the silver paste layer and the chip: FIG. 10 is a structural schematic diagram V of another chip heat dissipating structure provided by an embodiment of the present application, as shown in FIG. 10, if an upper surface of the wafer 6 is flush with an upper surface of the plastic encapsulating structure 8, then the silver paste layer is a silver paste layer with a uniform thickness.

Figure 11:
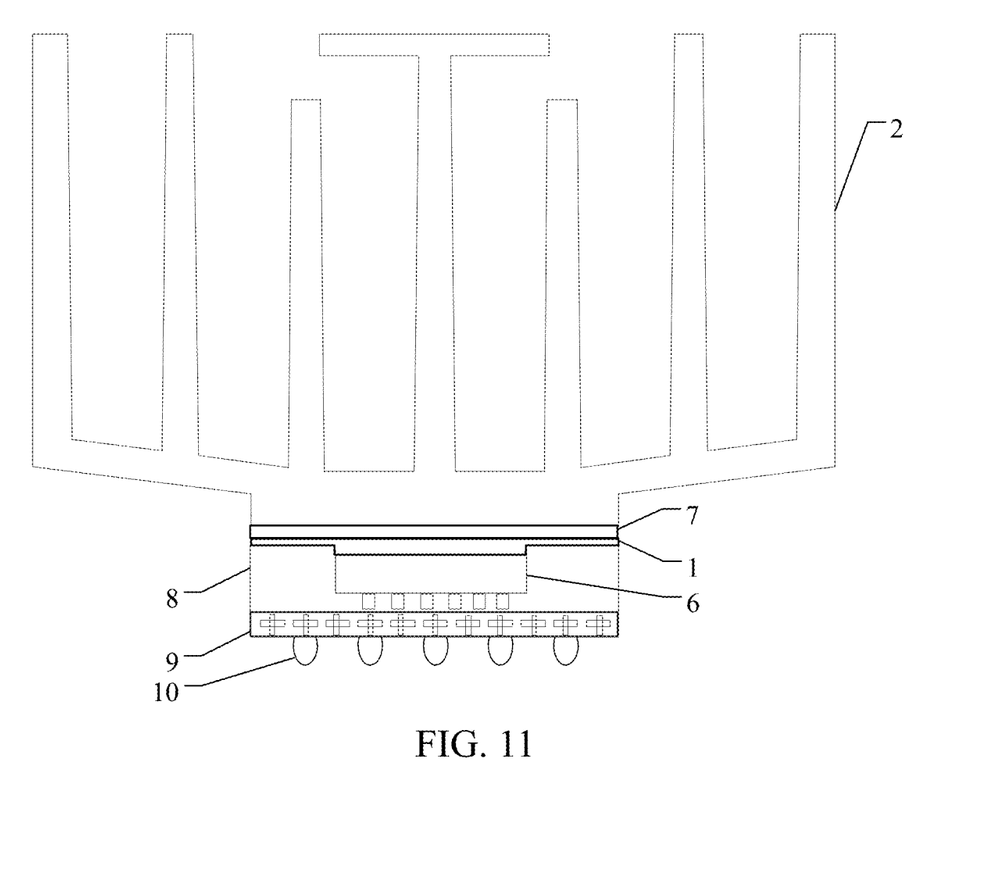
FIG. 11 is a structural schematic diagram VI of another chip heat dissipating structure provided by an embodiment of the present application.

An implementation II of the positional relationship between the silver paste layer and the chip: FIG. 11 is a structural schematic diagram VI of another chip heat dissipating structure provided by an embodiment of the present application, as shown in FIG. 11, if an upper surface of the wafer 6 is lower than an upper surface of the plastic encapsulating structure 8, a thickness of the silver paste layer is not uniform, the silver paste layer is thus embedded in a groove of the plastic encapsulating structure 8.

Figure 12:
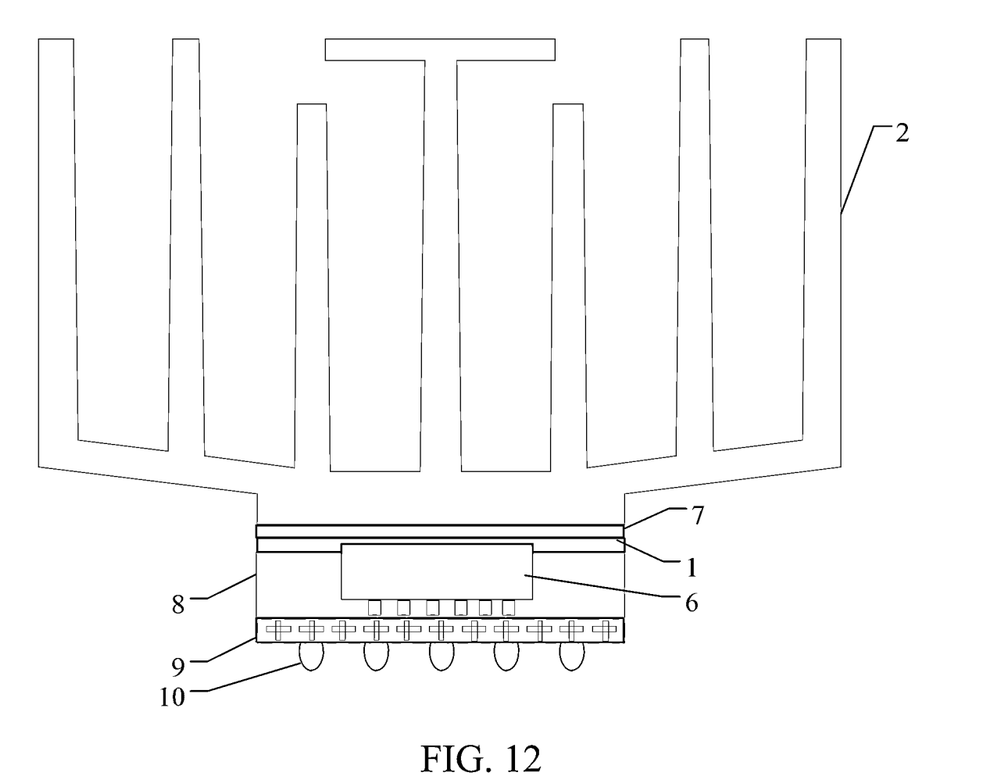
FIG. 12 is a structural schematic diagram VII of another chip heat dissipating structure provided by an embodiment of the present application.

An implementation III of the positional relationship between the silver paste layer and the chip: FIG. 12 is a structural schematic diagram VII of another chip heat dissipating structure provided by an embodiment of the present application, as shown in FIG. 12, if an upper surface of the wafer 6 is higher than an upper surface of the plastic encapsulating structure 8, a thickness of the silver paste layer is not uniform, the wafer 6 is embedded in the silver paste layer.

In this embodiment, a process of obtaining the chip heat dissipating structure is the following process.

Figure 13:
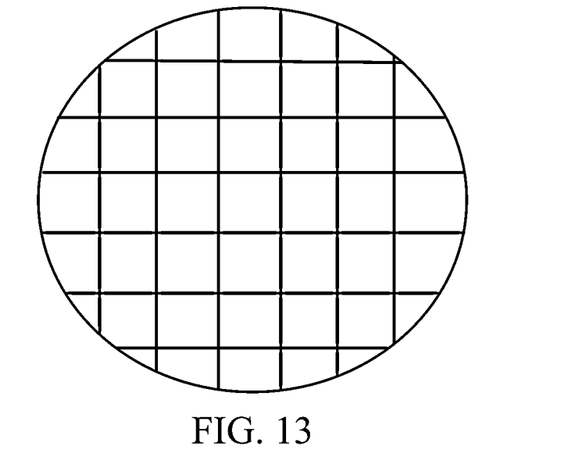
FIG. 13 is a structure schematic diagram of a diced wafer provided by an embodiment of the present application.

Step I, dicing the wafer.

FIG. 13 is a structure schematic diagram of a diced wafer provided by an embodiment of the present application. As shown in FIG. 13, the wafer 6 is firstly diced to obtain the diced wafer 6 as shown in FIG. 13.

Figure 14:
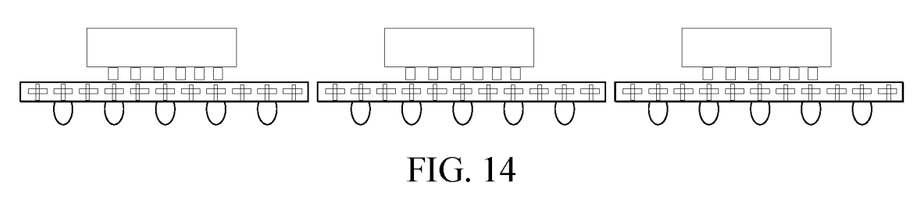
FIG. 14 is a process flow schematic diagram I of a chip provided by an embodiment of the present application.

Step II, mounting the wafer.

FIG. 14 is a process flow schematic diagram I of a chip provided by an embodiment of the present application. As shown in FIG. 14, the diced wafer 6 is respectively mounted on the substrate 9 of each chip.

Figure 15:
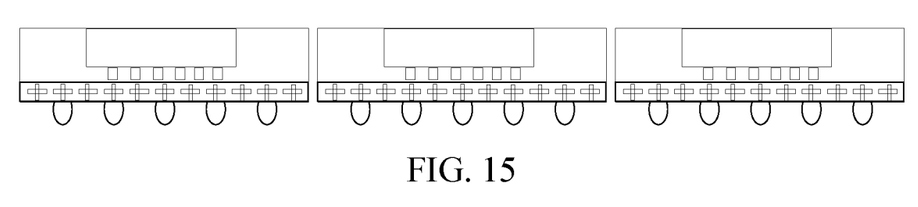
FIG. 15 is a process flow schematic diagram II of a chip provided by an embodiment of the present application.

Step III, plastic-encapsulating the chip.

FIG. 15 is a process flow schematic diagram II of a chip provided by an embodiment of the present application. As shown in FIG. 15, the wafer 6 on each substrate 9 is plastic-encapsulated, that is, the wafer 6 is plastic-encapsulated by the plastic encapsulating structure 8.

Figure 16:
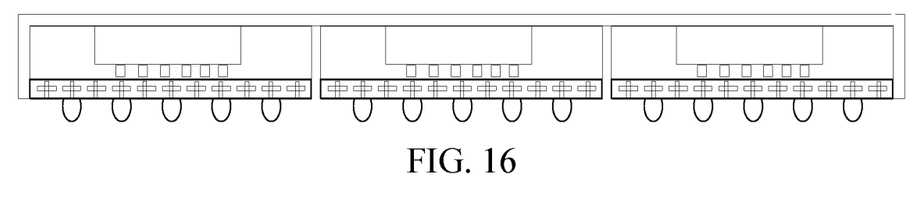
FIG. 16 is a process flow schematic diagram III of a chip provided by an embodiment of the present application.

Step IV, printing silver paste.

FIG. 16 is a process flow schematic diagram III of a chip provided by an embodiment of the present application. As shown in FIG. 16, the silver paste layer is arranged on the upper surface of the chip by adopting a silver paste printing technology.

Step V, curing the silver paste.

A silver paste curing process is performed to cure the silver paste layer on the upper surface of the chip.

Figure 17:
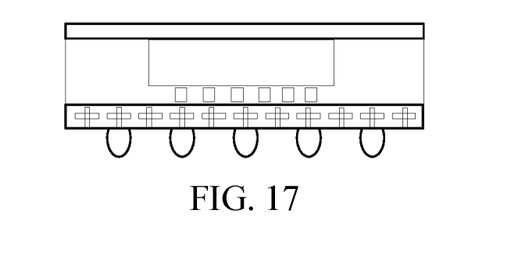
FIG. 17 is a process flow schematic diagram IV of a chip provided by the embodiment of the present application.

Step VI, separation processing.

FIG. 17 is a process flow schematic diagram IV of a chip provided by the embodiment of the present application. As shown in FIG. 17, strip singulation processing is performed on a respective chip to obtain the chip.

Step VII, soldering a solder.

A solder layer 7 may be arranged on the silver paste layer, and then the heat sink 2 and the solder layer 7 may be soldered together.

In this embodiment, by providing a chip heat dissipating structure composed of a metal layer 1, the chip heat dissipating structure is used to be arranged on the chip, the metal layer 1 is covered on a wafer 6 and a plastic encapsulating structure 8 of the chip, and a heat sink 2 is connected to the metal layer 1 via a solder layer 7; where the metal layer 1 is a silver paste layer. By adding a silver paste layer on the top of the chip through a method of silver paste printing, the heat sink 2 may be soldered onto the silver paste layer through the solder layer, and then the heat sink 2 is fixed to the top of the chip; the main component of the solder layer is metal tin, and the silver paste layer has a higher thermal conductivity than an epoxy resin material mounted on a traditional heat sink, thereby solving a problem of the heat dissipation bottleneck of a resin material in the chip; the silver paste layer and the solder layer 7 further accelerate the heat dissipation of the chip, hence improving a heat dissipation effect of the chip and preventing a large amount of heat from damaging the chip.

Figure 18:
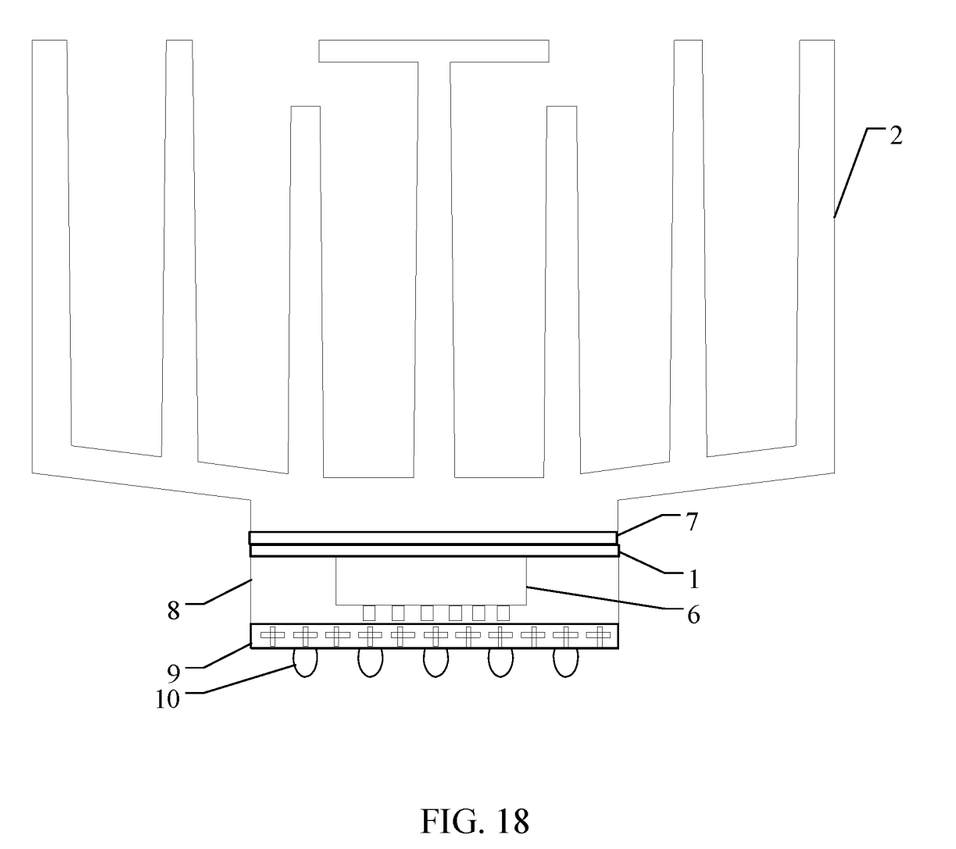
FIG. 18 is a structural schematic diagram I of a chip structure provided by an embodiment of the present application.
Figure 19:
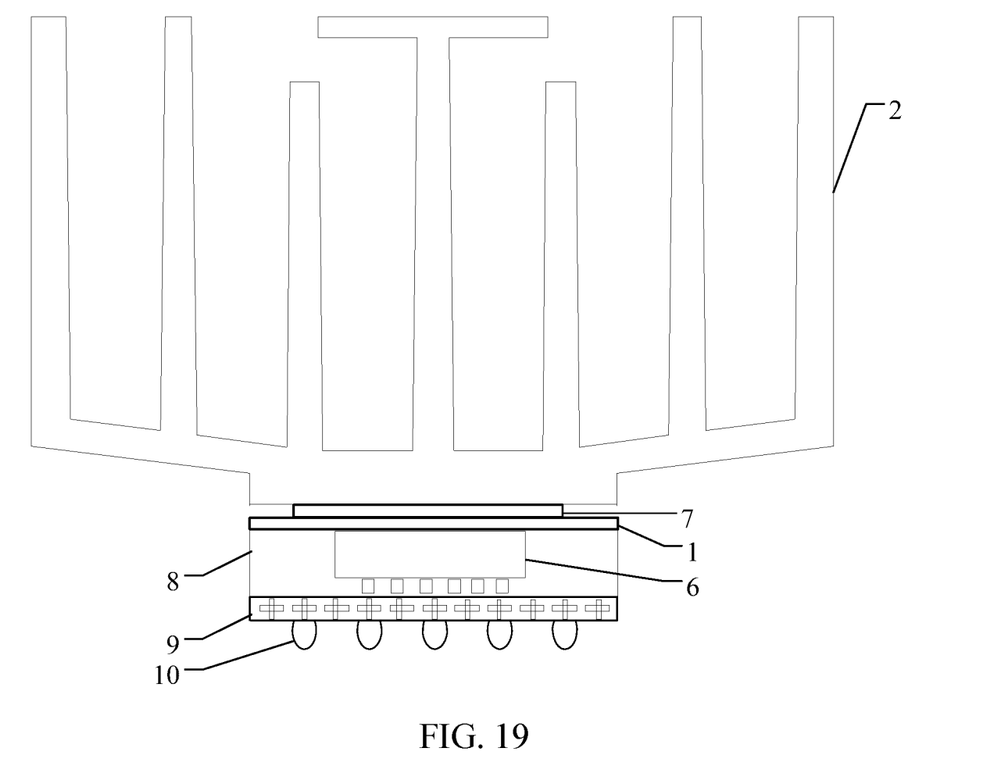
FIG. 19 is a structural schematic diagram II of a chip structure provided by an embodiment of the present application.

FIG. 18 is a structural schematic diagram I of a chip structure provided by an embodiment of the present application; FIG. 19 is a structural schematic diagram II of a chip structure provided by an embodiment of the present application; as shown in FIG. 18 and FIG. 19, the chip structure includes a chip body and a chip heat dissipating structure arranged on the chip body, where the chip heat dissipating structure adopts the chip heat dissipating structure provided in the above-mentioned embodiments.

Exemplarily, the chip body includes a wafer 6, a plastic encapsulating structure 8 and a substrate 9; a groove is arranged on the plastic encapsulating structure 8, and the wafer 6 may be arranged in the groove, and then the plastic encapsulating structure 8 is used to encapsulate the wafer 6 and an upper surface of the wafer 6 is exposed; the plastic encapsulating structure 8 is fixedly arranged on one side of the substrate 9; furthermore, at least one solder ball 10 may be arranged on the other side of the substrate 9, and the solder ball 10 is used to connect with a circuit board, so as to fix the chip on the circuit board.

Then, the chip heat dissipating structure provided in the above-mentioned embodiments is arranged on the chip body, and the metal layer 1 of the chip heat dissipating structure is arranged on the wafer 6 and the plastic encapsulating structure 8 of the chip body. The structure and principle of the chip heat dissipating structure may be referred to the above-mentioned embodiments, which will not be repeated.

In this embodiment, at least one hole may be opened on the plastic encapsulating structure 8; one or more of the at least one hole is provided with a thermally conductive structure. Optionally, the thermally conductive structure is a metal thermally conductive structure or a non-metal thermally conductive structure. Thus, by opening a hole on the plastic encapsulating structure 8 and providing a thermally conductive structure in the hole, dissipation of the chip structure can be further achieved.

For example, a material of the metal thermally conductive structure includes at least one or more of copper, aluminum, silver, tin, gold, iron, and aluminum alloy. A material of the non-metal thermally conductive structure includes at least one or more of resin, ceramic, graphite, graphene, and water.

In this embodiment, the chip heat dissipating structure provided in the above-mentioned embodiments is arranged on the chip body. A chip heat dissipating structure composed of a metal layer 1 is provided, the chip heat dissipating structure is used to be arranged on the chip, and the metal layer 1 is covered on a wafer 6 and a plastic encapsulating structure 8 of the chip, and a heat sink 2 is connected to the metal layer 1; furthermore, a heat sink may be connected to the metal layer 1. By adding a silver paste layer on the top of the chip through a method of silver paste printing, the heat sink 2 may be soldered onto the silver paste layer through the solder layer, so that the heat sink is fixed to the top of the chip; the main component of the solder layer is metal tin, and the silver paste layer has a higher thermal conductivity than an epoxy resin material mounted on a traditional heat sink, thereby solving a problem of the heat dissipation bottleneck of a resin material in the chip; the silver paste layer and the solder layer further accelerate the heat dissipation of the chip, hence improving a heat dissipation effect of the chip and preventing a large amount of heat from damaging the chip.

Figure 20:
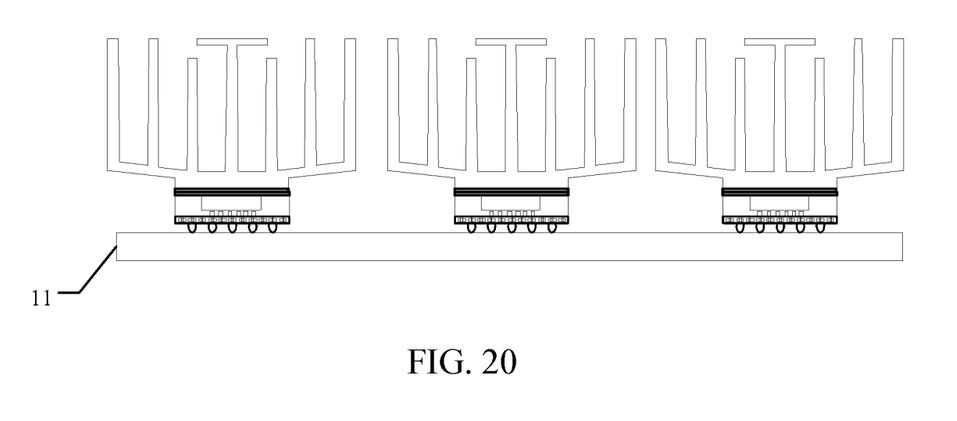
FIG. 20 is a structure schematic diagram of a circuit board provided by an embodiment of the present application.

FIG. 20 is a structure schematic diagram of a circuit board provided by an embodiment of the present application, as shown in FIG. 20, the circuit board 11 of the embodiment of the present application is provided with at least one chip structure of the above-mentioned embodiments.

Exemplarily, the circuit board 11 is provided with at least one chip structure of the above-mentioned embodiments, and the chip structure and a solder ball are fixedly connected to the circuit board 11.

A position and the number of chip structures on the circuit board 11 are not limited. For example, at least one chip structure may be arranged on an upper surface of the circuit board 11; alternatively, at least one chip structure may be arranged on an upper surface of the circuit board 11, and at least one chip structure may be arranged on a lower surface of the circuit board 11.

The specific structure of the chip structure on the circuit board 11 may be the same or not. For example, the upper surface of the wafer in one chip structure on the circuit board 11 is flush with the upper surface of the plastic encapsulating structure, and the upper surface of the wafer in another chip structure on the circuit board 11 is lower than the upper surface of the plastic encapsulating structure.

Among them, the structure and principle of the chip structure may be referred to the above-mentioned embodiments, which will not be repeated.

In this embodiment, by providing at least one chip structure of the above-mentioned embodiments on a circuit board 11, a chip body is provided with the chip heat dissipating structure provided by the above-mentioned embodiments. By adding a silver paste layer on the top of the chip through a method of silver paste printing, the heat sink may be soldered onto the silver paste layer through the solder layer, so that the heat sink is fixed to the top of the chip; the main component of the solder layer is metal tin, and the silver paste layer has a higher thermal conductivity than an epoxy resin material mounted on a traditional heat sink, thereby solving a problem of the heat dissipation bottleneck of a resin material in the chip; the silver paste layer and the solder layer further accelerate the heat dissipation of the chip, hence improving a heat dissipation effect of the chip and preventing a large amount of heat from damaging the chip.

Figure 21:
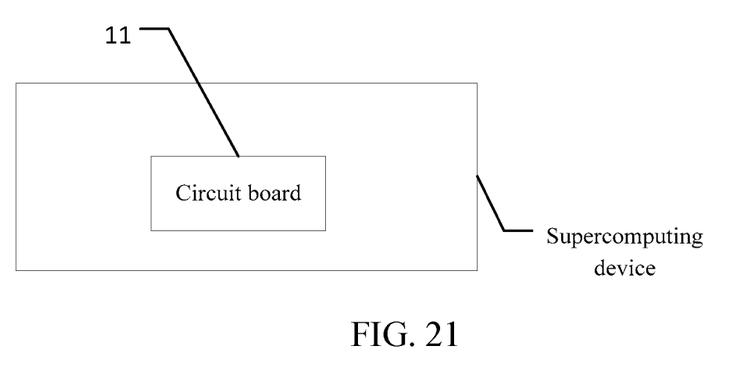
FIG. 21 is a structural schematic diagram of a supercomputing device provided by an embodiment of this application.

FIG. 21 is a structural schematic diagram of a supercomputing device provided by an embodiment of this application, as shown in FIG. 21, the supercomputing device provided in an embodiment of the present application is provided with at least one circuit board 11 provided in the above-mentioned embodiments.

Optionally, circuit boards 11 in the supercomputing device are connected in parallel with each other.

Optionally, a sliding groove may be arranged on a case of the supercomputing device, the sliding groove is used for slidable connection with each circuit board 11 in the supercomputing device.

Optionally, fans may also be arranged on both sides of the case of the supercomputing device, and a heat dissipation air duct of the fan may be consistent with a heat dissipating chamber of a heat sink on the circuit board 11, so as to quickly dissipate the heat generated by the circuit board 11 in the case to the outside of the case, thereby providing a performance of supercomputing device.

Exemplarily, one or more circuit boards 11 are arranged in the supercomputing device, and the circuit board 11 adopts the circuit boards 11 provided in the above-mentioned embodiments. The structure and function of the circuit board 11 may be referred to the introduction of the above-mentioned embodiments, which will not be repeated.

In this embodiment, multiple circuit boards 11 may be connected in parallel, and then the parallel circuit boards 11 may be arranged in the supercomputing device. In one implementation, the supercomputing device may be a supercomputing server.

A connection between the circuit board 11 and the supercomputing device may be a fixed connection or slidable connection. Exemplarily, one or more sliding grooves may be arranged on the case of the supercomputing device, and then the circuit board 11 is arranged in the sliding groove, so that the circuit board 11 may slide on the sliding groove.

Among them, when multiple circuit boards 11 are arranged in the supercomputing device, the structure of each circuit board 11 of the multiple circuit boards 11 may be the same or not.

Each circuit board 11 is provided with at least one chip structure of the above-mentioned embodiments, and the chip structure and a solder ball are fixedly connected to the circuit board 11.

Among them, the structure and principle of the chip structure may be referred to the above-mentioned embodiments, which will not be repeated.

In this embodiment, by providing one or more circuit boards 11 of the above embodiments in a supercomputer device, at least one chip structure of the above embodiments is arranged on each circuit board 11, and the chip heat dissipating structure provided by the above embodiment is arranged on the chip structure. By adding a silver paste layer on the top of the chip through a method of silver paste printing, the heat sink may be soldered onto the silver paste layer through the solder layer, so that the heat sink is fixed to the top of the chip; the main component of the solder layer is metal tin, and the silver paste layer has a higher thermal conductivity than an epoxy resin material mounted on a traditional heat sink, thereby solving a problem of the heat dissipation bottleneck of a resin material in the chip; the silver paste layer and the solder layer further accelerate the heat dissipation of the chip, hence improving a heat dissipation effect of the chip and preventing a large amount of heat from damaging the chip.

In the present application, although the terms "first", "second", etc. may be used in the present application to describe various elements, these elements should not be limited by these terms. These terms are only used to distinguish one element from another element. For example, without changing the meaning of the description, a first element may be called a second element, and likewise, a second element may be called a first element, as long as all occurrences of the "first element" are renamed consistently and all occurrences of the "second component" are renamed consistently. The first element and the second element are both elements, but they may not be the same element.

The terms used in the present application are only used to describe the embodiment but not used to limit the claim. For example, the singular forms "a", "an" and "the" used in the description of the embodiment and claim are intended to include plural forms unless limitation to the singular is explicitly stated. Similarly, the term "and/or" used in the present application refers to any and all possible combinations that include one or more of the associated lists. Furthermore, when used in this application, the term "comprise" and its variants "comprises" and/or "comprising" and the like refer to an existence of a stated feature, a whole, a step, an operation, an element, and/or a component, but does not exclude the existence or addition of one or more other features, wholes, steps, operations, elements, components, and/or groups of these.

The various aspects, implementations, realizations or features in the described embodiments can be used alone or in any combination.

The above technical description may refer to the drawings, which form a part of the present application, and the drawings show implementations in accordance with the described embodiments. Although these embodiments are described in sufficient detail to enable persons of ordinary skill in the art to implement these embodiments, these embodiments are non-limitative; so that other embodiments and changes may be used without departing from the scope of the described embodiments. For example, an order of operations described in the flowchart is non-limitative, so that the order of two or more operations illustrated in the flowchart and described according to the flowchart can be changed according to several embodiments. For another example, in several embodiments, one or more operations illustrated in the flowchart and described according to the flowchart are optional or can be deleted. Furthermore, certain steps or functions may be added to the disclosed embodiments, or the order of two or more steps may be replaced. All these changes are considered to be included in the disclosed embodiment and claim.

Furthermore, terms are used in the above technical description to provide a thorough understanding of the described embodiments. However, particular details are not required to implement the described embodiments. Therefore, the above description of the embodiments is presented for explanation and description. The embodiments presented in the above description and the examples disclosed according to these embodiments are provided separately, so that context may be added for facilitating understanding of the described embodiments. The above description is not intended to be exhaustive or to limit the described embodiments to the precise form of the present application. Based on the above teachings, several modifications, options and changes are feasible. In some cases, well-known processing steps are not described in detail to avoid unnecessarily affecting the described embodiments.

What is claimed is:

1. A chip heat dissipating structure arranged on a chip, wherein the chip heat dissipating structure comprises a metal layer, the metal layer being covered on the chip, and
   wherein the chip comprises a wafer and a plastic encapsulating structure;
   the metal layer is covered on the wafer and an upper surface of the plastic encapsulating structure of the chip;
   an upper surface of the wafer is higher than the upper surface of the plastic encapsulating structure, and the wafer is embedded in the metal layer;
   the chip further comprises a substrate;
   a groove is arranged on the plastic encapsulating structure, and the wafer is arranged in the groove;
   the plastic encapsulating structure is used to encapsulate the wafer, and the upper surface of the wafer is of an exposed die structure;
   the plastic encapsulating structure is fixedly arranged on one side of the substrate; and
   at least one solder ball is arranged on another side of the substrate and outside the plastic encapsulating structure, and the solder ball is used to connect with a circuit board for fixing the chip on the circuit board.

2. The chip heat dissipating structure according to claim 1, wherein the chip heat dissipating structure further comprises: a heat sink connected with the metal layer.

3. The chip heat dissipating structure according to claim 1, wherein an area of the metal layer is the same as an area of an upper surface of the chip.

4. The chip heat dissipating structure according to claim 1, wherein the metal layer is a silver paste layer.

5. The chip heat dissipating structure according to claim 2, wherein the metal layer is a silver paste layer.

6. The chip heat dissipating structure according to claim 1, wherein the metal layer is a silver paste layer.

7. The chip heat dissipating structure according to claim 4, wherein a thickness of the silver paste layer is 1-5 microns.

8. The chip heat dissipating structure according to claim 2, wherein the heat sink is soldered onto the metal layer through a solder layer.

9. The chip heat dissipating structure according to claim 8, wherein a solder in the solder layer is tin.

10. The chip heat dissipating structure according to claim 9, wherein a thickness of the solder layer is 0.1-0.15 millimeters.

11. The chip heat dissipating structure according to claim 8, wherein an area of the solder layer is the same as an area of the metal layer, or an area of the solder layer is the same as an area of a lower surface of the heat sink.

12. A chip structure, comprising a chip body and the chip heat dissipating structure according to claim 1 substantially arranged on the chip body.

13. A circuit board, wherein at least one of the chip structure according to claim 12 is arranged on the circuit board.

14. A supercomputing device, wherein at least one of the circuit board according to claim 13 is arranged in the supercomputing device.

15. The chip heat dissipating structure according to claim 1, wherein a surface area of the metal layer is equal to or greater than a sum of a surface area of the wafer and a surface area of the plastic encapsulating structure.

* * * * *